United States Patent [19]

Hughes, Jr.

[11] Patent Number: 4,493,079
[45] Date of Patent: Jan. 8, 1985

[54] METHOD AND SYSTEM FOR SELECTIVELY LOADING TEST DATA INTO TEST DATA STORAGE MEANS OF AUTOMATIC DIGITAL TEST EQUIPMENT

[75] Inventor: John H. Hughes, Jr., Cohoes, N.Y.

[73] Assignee: Fairchild Camera and Instrument Corp., Clifton Park, N.Y.

[21] Appl. No.: 409,068

[22] Filed: Aug. 18, 1982

[51] Int. Cl.³ .............................................. G06F 11/00
[52] U.S. Cl. ......................................... 371/27; 371/20
[58] Field of Search ................ 324/73 R; 371/20, 24, 371/25, 27

[56] References Cited

U.S. PATENT DOCUMENTS 4,108,358  8/1978  Niemaszyk et al. ................... 371/20
4,402,081  7/1983  Ichimiya et al. ..................... 371/27 X
4,433,414  2/1984  Carey .............................. 371/25 X Primary Examiner—Jerry Smith
Assistant Examiner—M. Ungerman
Attorney, Agent, or Firm—Randall J. Gort

[57] ABSTRACT

A method and system for loading test data into individual pin memories of an automatic digital test system, particularly of the in-circuit type. Test data in the form of test vectors are accessed from a test vector store simultaneously with the access of a digital test pin selection signal. The test pin selection signal accessed with the test data is then used to selectively load the test data into a pin memory identified by the pin selection signal, thereby permitting the loading of test data into any one of a group of individual pin memories. In the preferrred embodiment the test data, a test vector, is stored in a test vector store in association with a test pin selection signal. When the test vector is read from memory, the test pin selection signal is also read by the same address signal.

8 Claims, 5 Drawing Figures

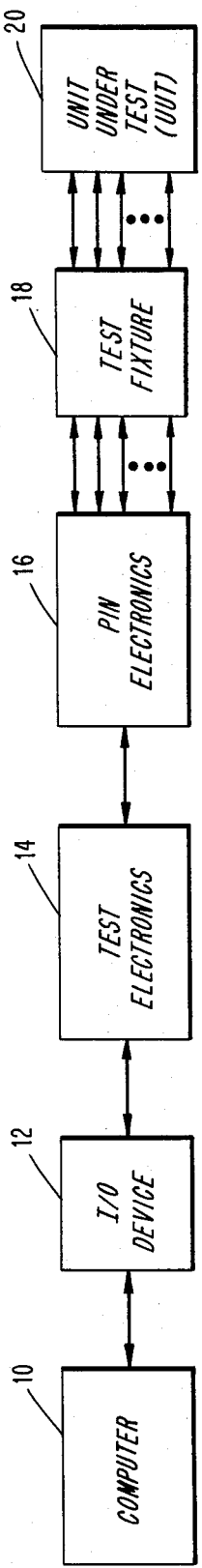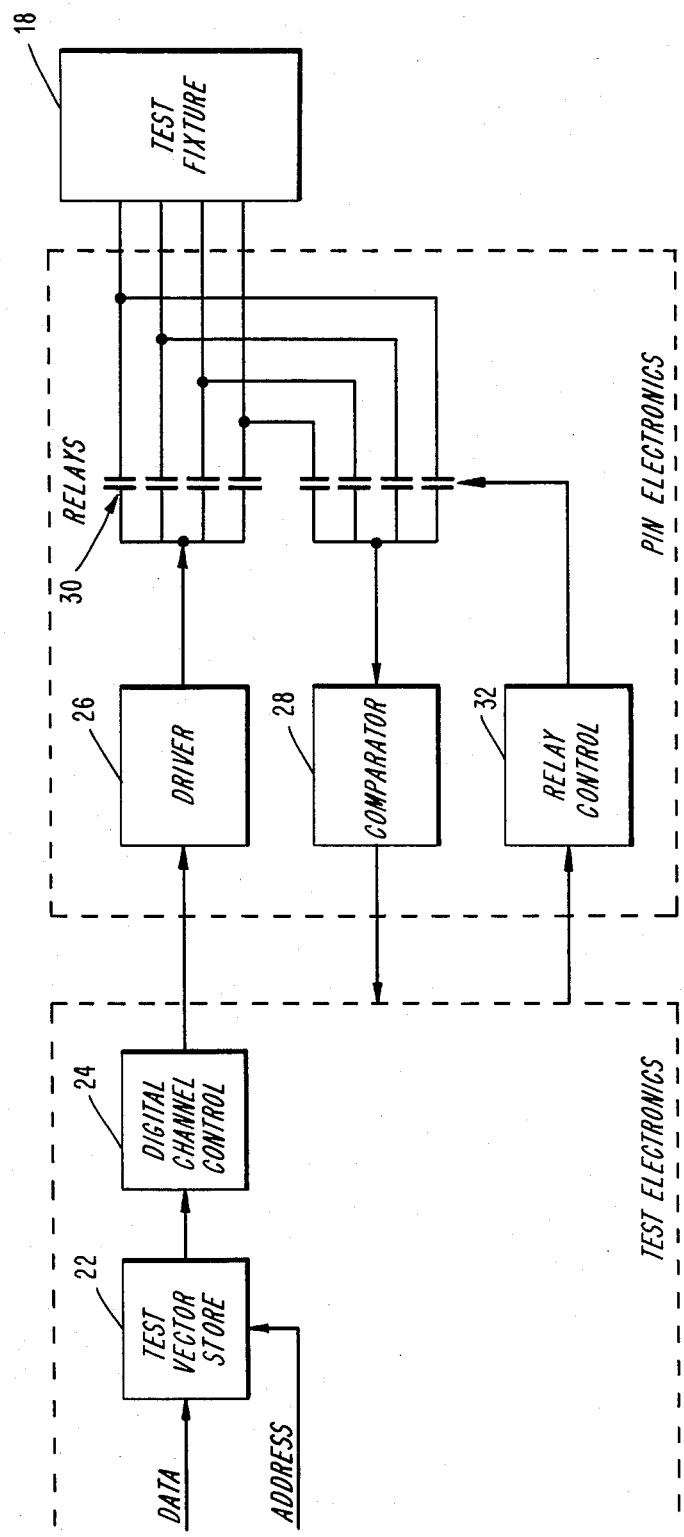

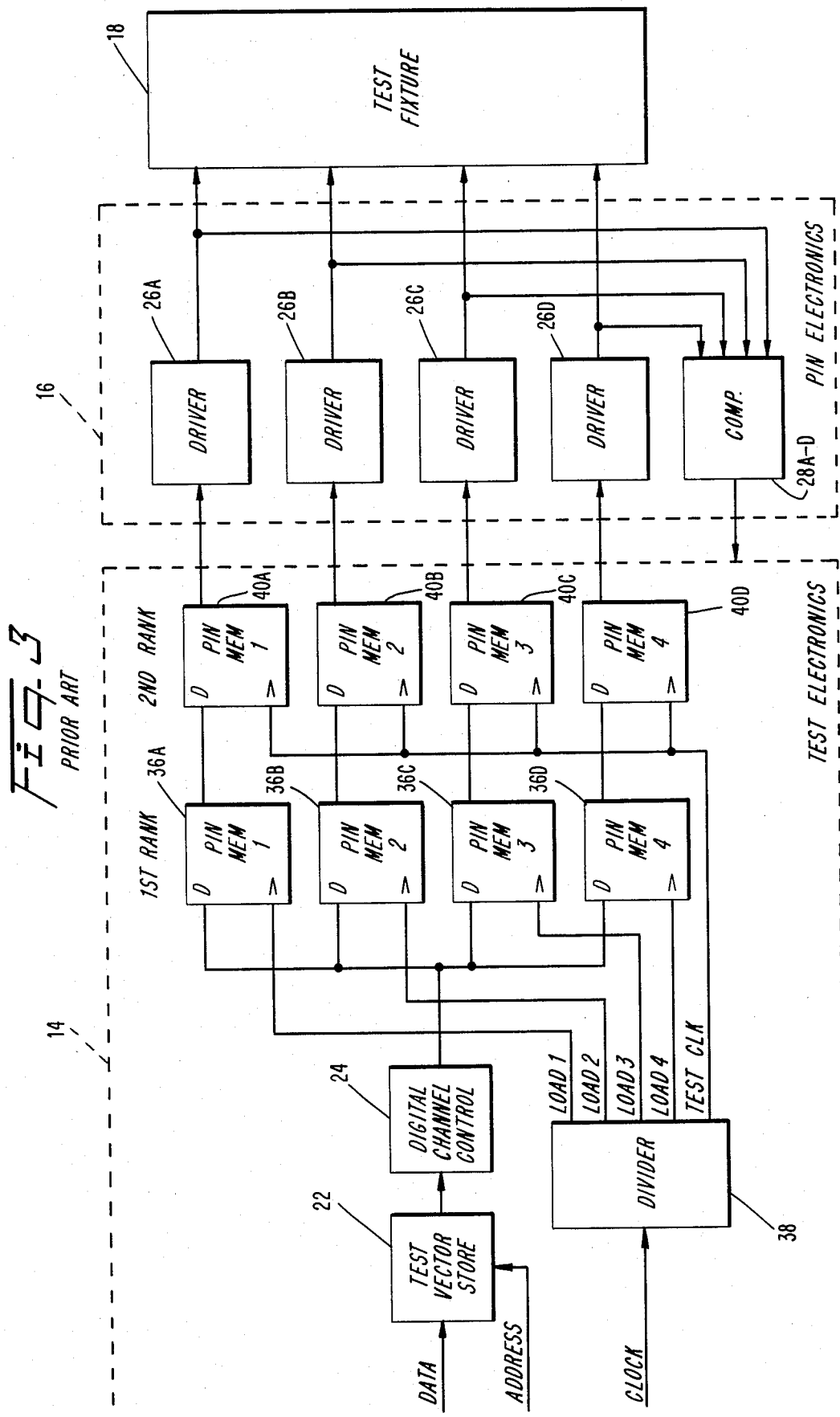

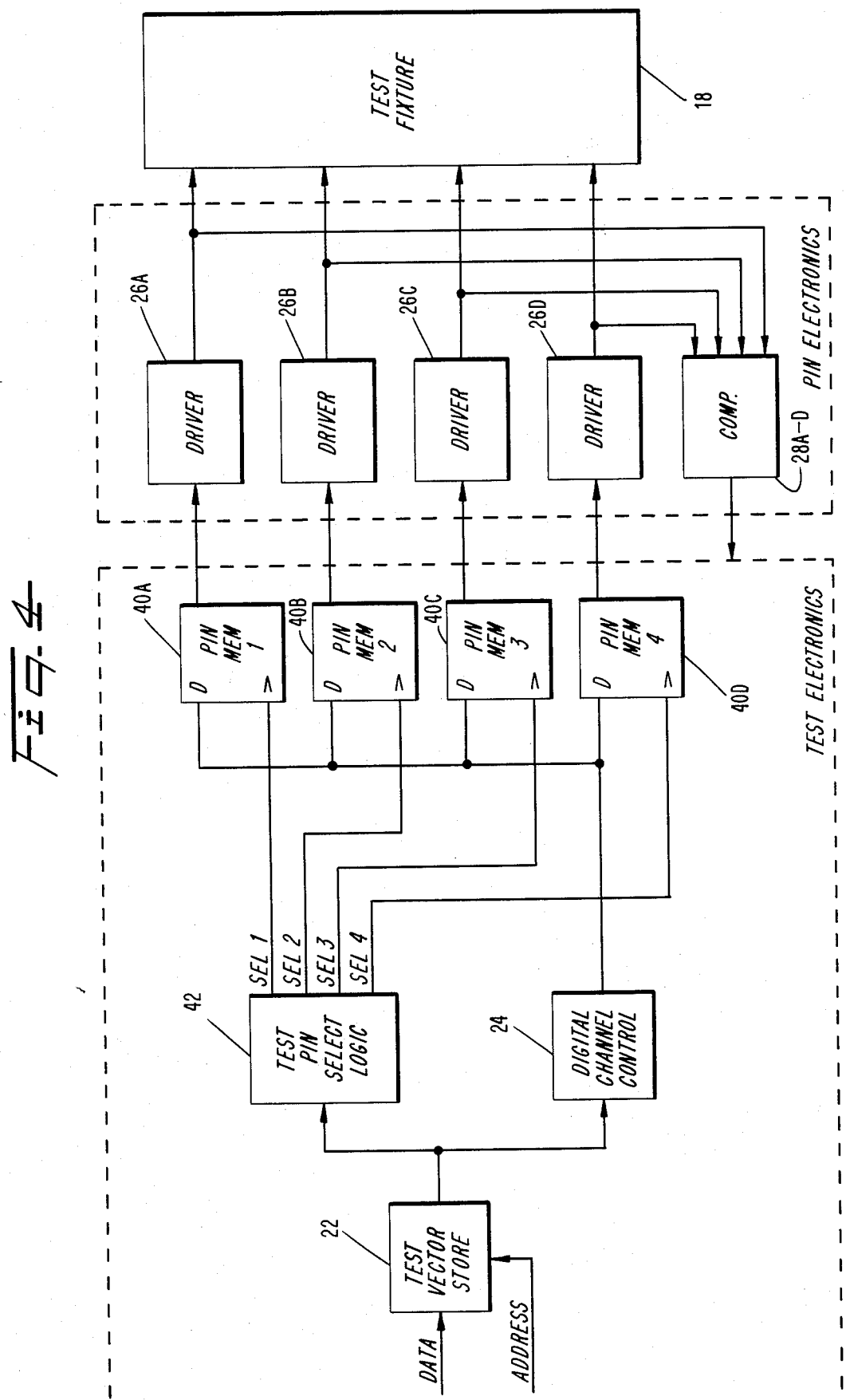

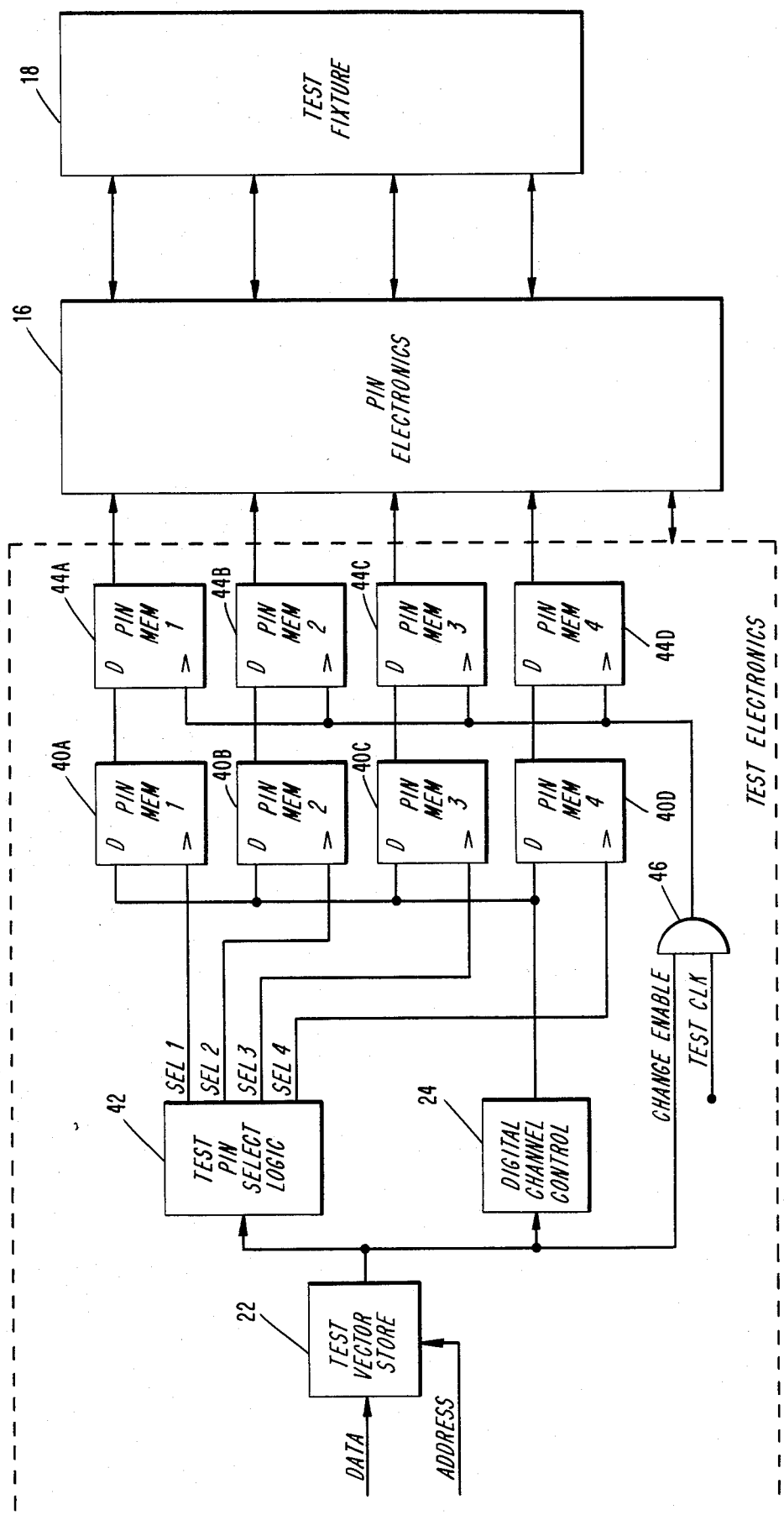

METHOD AND SYSTEM FOR SELECTIVELY LOADING TEST DATA INTO TEST DATA STORAGE MEANS OF AUTOMATIC DIGITAL TEST EQUIPMENT

BACKGROUND OF THE INVENTION

The present invention relates to automatic digital test systems, particularly of the in-circuit type, for testing digital devices such as integrated circuits, and more particularly to a method and system for selectively loading test data into test data storage means associated with test pins of an automatic digital test system.

Automatic digital test systems used to test digital devices have become more and more sophisticated as the complexity of the devices tested by such systems has increased. Typical large scale integrated (LSI) circuits, for example, may require a rather complicated series of tests in order to insure that such circuits are fully operational. Accordingly, various methods for speeding up the test procedures have been developed in an effort to minimize test time as the devices increase in complexity. This effort to save test time has also been accompanied by efforts to reduce programming complexity and equipment costs while maintaining or even increasing the versatility of the automatic test equipment.

One area of particular interest has been that relating to the transfer of test signals to and from the drivers and comparators ("pin electronics") which stimulate and monitor the test pins connecting the tester to the component or device under test. For example, because of the speed constraints inherent in applying test signals to the pin electronics directly from the computer controlling the test operations, individual memories have been utilized to receive test signals from the computer and to then supply them directly to the pin electronics. In this manner, the patterns of test signals (vectors) for numerous test cycles can be stored in the individual memories and supplied rapidly to the to the pin electronics at a rate greater than that of the computer. A discussion of this problem is set forth in greater detail in U.S. patent application Ser. No. 312,839 filed Oct. 19, 1981 by the present inventor, and Ser. No. 307,322 filed Sept. 30, 1981 now U.S. Pat. No. 4,433,414 by Maurice Carey, both of which are assigned to the assignee of the present invention and are hereby incorporated herein by reference.

Typically, the test signals or test vectors are first transferred from the computer into an addressable memory. In one known system they are then supplied through the pin electronics to the appropriate test pins on the test fixture through relay multiplexing onto a fixed pattern of pins. In another known system, the stored test signals are transferred from the addressable memory by time domain multiplexing into a fixed pattern of pin memories and then through the pin electronics onto the individual pins. These approaches avoid the need to directly transfer test signals from the computer to the pin electronics at the computer rate. However, the slow response time of electro-mechanical relays in a relay multiplexing system necessitates that the selection of individual test pins be done between test of devices. The time domain multiplexing approach does not suffer from this slow relay response time, but the fixed nature of the test signal sequence presented to the individual pin memories detracts considerably from the versatility of such an approach. In particular, since the data for a group of pins are presented in a fixed, consecutive sequence, the data for the last pin memory must await entry of all other data before it can be entered even if there are no changes in the earlier presented data. This, of course, requires more time than it would to merely modify the contents of a single pin memory directly.

OBJECTS AND BRIEF SUMMARY OF THE INVENTION

Accordingly, it is an object of the present invention to provide a novel method and system for providing test signals to the pin electronics of a digital tester in a manner which permits the supplying of test signals to test pins of a digital tester individually and in any order.

It is a further object of the present invention to provide a novel automatic digital test method and apparatus in which test vectors are transferred to individual pin memories on a selective basis unrelated to the sequence of the vectors but rather, on the basis of pin selection data associated with the test vector.

In accordance with the present invention, the foregoing and other objects and advantages are accomplished through the provision of a system that selectively loads test data into test data storage means individually associated with test pins of an automatic digital tester. More specifically, a digital test pin selection signal is accessed simultaneously with the access of test data associated with a pin identified by the test pin selection signal. The accessed digital test pin selection signal then controlls the loading of the test data into an individual pin memory associated with the pin identified by the pin selection signal. In this manner, test data may be stored in any individual pin memory in any sequence, i.e., regardless of the sequence of arrival of the test data from other storage means.

BRIEF DESCRIPTION OF THE DRAWINGS

FIG. 1 is a functional block diagram of a typical automatic digital test system of the in-circuit type;

FIG. 2 is a functional block diagram of a portion of the digital test system of FIG. 1 illustrating in greater detail one known relay multiplexing scheme for stimulating individual test pins;

FIG. 3 is a functional block diagram of one portion of the digital test system of FIG. 1 illustrating one known time domain multiplexing scheme for loading individual pin memories;

FIG. 4 is a functional block diagram of a portion of a digital test system of the type illustrated in FIG. 1 showing a preferred embodiment of the present invention; and, FIG. 5 is a functional block diagram of an embodiment of the present invention as utilized in conjunction with a test signal loading scheme wherein only changes in test data are loaded into the individual pin memories.

DETAILED DESCRIPTION

FIG. 1 functionally illustrates a typical test system of the type utilized to test integrated circuits or other components mounted on a printed circuit board. Such test systems, usually referred to as "incircuit" testers, may be more fully understood with reference to U.S. Pat. No. 3,870,953 and more recent patents in this field. As will be appreciated by one skilled in the art, the present invention is particularly useful in such test systems, although it may be useful in other high speed, automatic test systems in which a number of stimulus signals are selectively generated for test purposes. Accordingly, while the invention is described in connection with an in-circuit component tester, it will be appreciated that the utility of the invention is not so limited.

Referring to FIG. 1, a typical digital in-circuit tester is controlled by a computer 10 which communicates through a suitable interface 12 with the system test electronics 14. The test electronics 14 receives data from the computer 10 and supplies appropriate control signals to drivers and comparators in a section of the system typically referred to as the "pin electronics" 16. The drivers in the pin electronics 16 produce stimulus signals of appropriate magnitude and duration in response to the signals from the test electronics 14 and supply these stimulus signals either directly, as illustrated, or through an appropriate switching or relay network to a test fixture 18. The test fixture 18 provides a connection between the tester and an electronic unit under test (UUT) 20. This fixture may be, for example, a conventional "bed of nails" fixture which contains numerous nails or pins to establish electrical contact with nodes on a printed circuit board and thereby provide access to the terminals of each individual component or device under test (DUT) on the unit under test.

Each circuit node contacted by the pins of the test fixture 18 is also connected to the comparators in the pin electronics 16. The comparators selectively determine the logic state of any signal level present on the nodes to which they are connected. The comparators, in turn, supply information to the test electronics 14 regarding the results of each test and this information is supplied to the computer 10 in order to process these results and indicate the success or failure of the test, the nature of any failures, etc.

In a test system such as the one illustrated, the unit under test 20 may have thousands of test points or nodes which must be accessed to test the unit entirely. Accordingly, the test fixture 18 necessarily will have thousands of pins in order to provide access to each node. It will thus be appreciated that the rapid application of stimulus signals to appropriate pins of the test fixture and the monitoring of appropriate pins to determine the results of tests may be quite complicated.

One known approach to automatically stimulating and monitoring appropriate test points of a unit under test is illustrated generally in FIG. 2. Referring to FIG. 2, test vectors—signals providing information as to the nature of the stimulus signals and the nature of the expected results of the test—are provided to a test vector store 22 in the test electronics 14. Each test vector is typically a multi-bit signal that defines a pattern of stimulus and expected response signals for a test cycle. The test vector store, for example a random access memory (RAM), is addressed in a particular sequence by a sequencer (not shown) under the control of the computer 10 of FIG. 1 in order to execute each test pattern defined by the test vectors. In the system shown in FIG. 2, the test vectors in the test vector store 22 are supplied through a digital channel control 24 as they are read from the test vector store 22, and the digital channel control 24 in turn controls the drivers and comparators (only one of each shown) in the pin electronics 16. Each driver 26 is connected through a matrix of relay contacts generally indicated at 30 so that stimulus signals may be selectively applied to appropriate pins on the test fixture 18 and selected pins can be monitored. A relay control 32 controls the opening and closing of the relay contacts as a function of which pins are to be stimulated or monitored.

The system of FIG. 2 provides a form of electromechanical, relay multiplexing in the sense that a single driver may be utilized to provide a stimulus signal to any one of a number of test points and a single comparator may be utilized to monitor and test signals at any one of a number of test points. While this approach greatly reduces the number of drivers and comparators required for an in-circuit test, the slow response time of electromechanical relays necessitates that the selection of a particular pin by the relays be accomplished between test of devices or parts of devices while the next set of test data is being loaded. In addition, it will be appreciated that the relay connections to the test fixture 18 must be carefully chosen for a particular unit under test so as to avoid having one group of relay contacts associated with one driver or one comparator connected to test points which must be simultaneously stimulated with different stimulus signals or simultaneously monitored with respect to different expected test results.

Another known approach to selectively stimulating and monitoring nodes of a circuit under test is functionally illustrated in FIG. 3. Referring to FIG. 3, test data is stored in the text vector store 22 and, as this data is addressed, it is applied through the channel control 24 to the data input terminal of each of a plurality of conventional storage devices or memories 36A–36D which together provide a first rank memory for four pins on the test fixture 18.

The data signal (test vector) applied to each of the first rank pin memories is clocked into each memory 36A–36D by sequential clocks LOAD1–LOAD4, respectively, illustrated for clarity as being produced by a conventional divider circuit 38 from a system clock signal CLOCK. The data signal appearing on the output terminal of each memory 36A–36D is applied to a data input terminal of a respective one of four second rank storage devices or pin memories 40A–40D. A test clock signal TEST CLK applied to the load or enable input terminal of each second rank memory 40A–40D (the individual pin memories) clocks this data into these memories at the end of one load cycle (i.e., after the LOAD1–LOAD4 clocks have clocked each associated first rank memory).

The pattern of test data (test vector) loaded in the foregoing manner into the individual pin memories 40A–40D are supplied to the respective drivers 26A–26D and comparators 28A–28D (latter connection not shown) in the pin electronics 16. While the test commanded by the vector in the individual pin memories is being performed by the system, another test vector is loaded into the first rank memory by the LOAD1–LOAD4 clock signals as was described previously. These signals are then clocked into the individual pin memories 40A–40D by the TEST CLK signal to effect the next test cycle.

It will be appreciated that the approach to loading the test vectors shown in FIG. 3 requires that the individual pin memories containing the test vector be loaded in one and only one sequence, i.e., the first pin memory 40A is loaded, then the second pin memory 40B is loaded, etc. Thus, if only the third pin memory 40C must be altered, it cannot be altered directly; it must be altered on the third clock pulse LOAD3. The present invention, on the other hand, provides complete versatility in test vector loading, allowing any individual pin memory to be loaded in any order.

Referring now to FIG. 4 wherein a preferred embodiment of the present invention is illustrated functionally, the data in the test vector store is applied to the digital channel control 24 and to test pin select logic 42. The output signal from the digital channel control 24 is supplied to the data input terminal D of each of the individual pin memories 40A–40D. The test pin select logic 42 provides four output signals SEL1-SEL4 which are applied to the load input terminals of the respective pin memories 40A–40D. The pin memories are connected to the drivers and comparators 26A–26D, 28A–28D which are in turn connected to the test fixture 18 as was previously described.

In operation, the data loaded into the test vector store includes the test vectors and a pin selection data word in association with each part of a stored test vector. The pin selection data word contains data sufficient to define any one particular memory of the group of pin memories. For example, in the illustrated embodiment with four individual pin memories, the pin selection data word may be a two bit word, allowing selection of any one of the four memories (e.g., 00=pin memory one, 10=pin memory two, 01=pin memory three, and 11=pin memory four). Thus, in essence, the test vector store ie expanded by N bits of selection data which are sufficient to define 1 of $2^N$ test pins.

When the test vector data is read from the test vector store 22, the selection data word associated with that vector data is simultaneously read and applied to the test pin select logic 42. The test pin select logic decodes the selection data word and loads the test vector data into the pin memory specified by the data word. Thus, for example, if the first test vector data read from the test vector store has a 01 data word associated therewith, the select logic 42 decodes the data word as the SEL3 signal and the test vector data is loaded into the pin memory 3 (40C).

It can be seen that the test vector data is presented at the data input terminal of each of the individual pin memories and can be loaded into any one of these memories selected by the associated pin selection data word. In this regard, to insure that the test vector data and its selection data word are accessed in association with each other, the data word and the vector data are preferably stored together in the vector store 22 so that a single memory address accesses both data. After four consecutive vector data have been accessed and stored in the pin memories, the test cycle can proceed to completion and a new set of test vector data may be entered into the pin memories.

FIG. 5 illustrates an embodiment of the present invention which takes advantage of the change bit concepts set forth in previsouly referenced U.S. patent application Ser. No. 307,322 by Carey, now U.S. Pat. No. 4,433,414. In the FIG. 5 embodiment, the output signals from the pin memories 40A–40D are applied to the data input terminals of respective memories 44A–44D. The change enable signal (transition bit) stored in the vector store and accessed as part of the test vector as described in the referenced Carey application, is applied to one input terminal of a two input terminal AND gate 46 and the test clock signal TEST CLK is supplied to the other input terminal of the AND gate. The output signal from the AND gate is applied to the load or enable input terminal of each of the memories 44A–44D.

In operation, the test vector data is selectively loaded into the memories 40A–40D as was previously described. Whenever there is a change in one or more test vectors for the next test cycle, the change enable signal transfers the new test vector data from the memories 40A–40D into the memories 44A–44D. For each test cycle in which there is no change in any of the test vector data associated with the pin memories 40, 44 the data in the memories 44 remains the same as for the previous cycle and the AND gate 46 is not enabled by the change enable signal.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Moreover, variations and changes may be made by those skilled in the art without departing from the spirit of the present invention.

What I claim is:

1. In a digital test system including a plurality of test pins and test data storage means individually associated with each of the test pins, a system for selectively loading test data into the test data storage means comprising:
    means for associating a digital test pin selection signal with said test data; and,
    control means responsive to the digital test pin selection signal for controlling the selective loading of said test data into test data storage means associated with a test pin designated by the test pin selection signal, whereby test data may be loaded into any of a plurality of test data storage means in any sequence.

2. The system of claim 1 wherein each of said test data storage means comprises an individual memory associated with a test pin, each individual memory having an enable input terminal an a data input terminal, whereby test data presented on said data input terminal will be loaded into said memory when said control means provides said memory with an enable signal on said enable input terminal, the test data signal being simultaneously presented on the data input terminal of a plurality of the individual memories.

3. The system of claim 2 wherein said control means comprises means for selectively applying an enable signal to an enable input terminal of one of the plurality of individual memories in response to said digital test pin selection signal.

4. The system of claims 1, 2 or 3 including means for storing in association in a common memory the digital test pin selection signal and the test data for a pin designated by said selection signal, whereby said digital test pin selection signal and its associated test data can be simultaneously accessed by retrieval from said common memory.

5. A method for selectively loading test data into test data storage means associated with each of a plurality of test pins in an automatic test system comprising the steps of:
    storing a plurality of digital signals each representing test data for a test pin and selection data identifying associated ones of said plurality of test pins;
    selectively accessing each of said stored plurality of digital signals on an individual basis; and,
    selectively storing, in response to the selection data in each accessed digital signal, the test data in each accessed digital signal in storage means associated with individual test pins identified by the selection data associated with the test data being stored.

6. A method for selectively loading test vectors into individual pin memories in an automatic digital tester comprising the steps of:
    storing a plurality of test vectors each in association with a pin identifying signal;
    individually accessing the stored test vectors and their associated pin identifying signals; and,
    storing each accessed test vector in an individual pin memory selected in response to the pin identifying signal associated with the test vector.

7. The method of claim 6 wherein the accessed test vectors are stored by applying each accessed test vector to each of a plurality of individual pin memories, and enabling one of the plurality of individual pin memories to store the applied test vector in response to a pin identifying signal corresponding to said one pin memory.

8. The method of claim 6 or 7 wherein the pin identifying signal is a multi-bit digital signal and including the step of decoding the multi-bit digital signal to provide a storage enable signal which is applied to only one individual pin memory.

* * * * *